US006797335B1

United States Patent
Paderov et al.

(10) Patent No.: US 6,797,335 B1
(45) Date of Patent: Sep. 28, 2004

(54) METHOD FOR DEPOSITION OF WEAR-RESISTANT COATINGS AND FOR INCREASING THE LIFESPAN OF PARTS

(76) Inventors: Anatol y Nikolaevich Paderov, ul. Soni Morozovoy 19, kv. 29, Ekaterinburg, 620026 (RU); Jouri Genrihovich Ve Xler, ul. Tveritina 11, kv. 39, Ekaterinburg, 620100 (RU)

(*) Notice: Subject to any disclaimer, the term of this patent is extended or adjusted under 35 U.S.C. 154(b) by 0 days.

(21) Appl. No.: 09/700,473

(22) PCT Filed: Sep. 14, 1999

(86) PCT No.: PCT/RU99/00336

§ 371 (c)(1),
(2), (4) Date: Jun. 5, 2001

(87) PCT Pub. No.: WO01/12872

PCT Pub. Date: Feb. 22, 2001

(30) Foreign Application Priority Data

Aug. 16, 1999  (RU) ........................................... 99118131

(51) Int. Cl.⁷ .................... C23C 14/18; C23C 14/48; C23C 14/58; B32B 7/02; B32B 15/04
(52) U.S. Cl. .................. 427/530; 427/528; 427/577; 204/195.16; 428/689; 428/697; 428/698; 428/704; 428/539.5; 428/336
(58) Field of Search ............................... 427/528, 529, 427/530, 531, 576, 577; 204/192.16; 428/689, 697, 698, 699, 704, 539.5, 336

(56) References Cited

U.S. PATENT DOCUMENTS 3,900,592 A * 8/1975 Kennedy et al.
3,915,757 A * 10/1975 Engel (List continued on next page.)

FOREIGN PATENT DOCUMENTS

| GB | 2 197 346 | | 5/1988 | |
|---|---|---|---|---|
| JP | 63166957 A | * | 7/1988 | ................. 428/698 |
| JP | 40-1168856 A | * | 7/1989 | |
| JP | 40-2163362 A | * | 6/1990 | |
| JP | 40-5148649 A | * | 6/1993 | |
| RU | 2061090 | | 5/1996 | |
| RU | 2062818 | | 6/1996 | |
| RU | 2065505 | | 8/1996 | |
| RU | 2106429 | | 3/1998 | |
| RU | 2113971 C1 | * | 6/1998 | |
| RU | 2176184 C2 | * | 11/2001 | |

*Primary Examiner*—Marianne Padgett
(74) *Attorney, Agent, or Firm*—Collard & Roe, P.C.

(57) ABSTRACT

This invention relates to metallurgy and machine building, more specifically to the development of a method that improves service life, durability and repair of machine components by applying coatings to working surfaces followed by special treatment of the surfaces.

Figure 1:
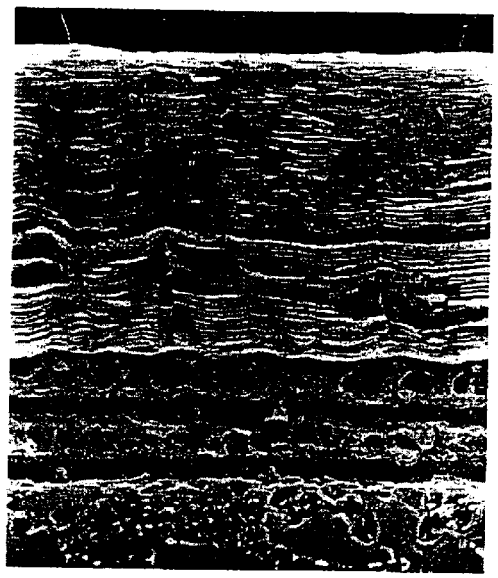

The essence of the invention is deposition of erosion and corrosion resistant coatings on machine components, that comprises a plurality of microlayers wherein each of the microlayers comprises one or more elements selected from the transition metal group, solid solutions or interstitial phases based thereon, and wherein one or more of the microlayers is subjected to high energy non-metallic ion deposition that causes changes in structure and composition of the deposited microlayer thus improving performance characteristics. After the full coating has been deposited, a vibromechanical treatment with micro-pellets is applied to the surface of machine components, that improves distribution of residual stresses.

The method makes it possible to deposit coatings having high resistance to wear and corrosion, and having a sufficient level of fatigue strength of machine components, primarily gas-turbine compressor blades and vanes.

14 Claims, 6 Drawing Sheets

U.S. PATENT DOCUMENTS

| | | | |
|---|---|---|---|
| 4,402,994 A | * | 9/1983 | Kobayashi et al. |
| 4,629,631 A | * | 12/1986 | Dearnaley |
| 4,634,600 A | * | 1/1987 | Shimizu et al. |
| 4,683,149 A | * | 7/1987 | Suzuki et al. |
| 4,729,905 A | * | 3/1988 | Zhed et al. |
| 4,758,978 A | * | 7/1988 | Cruess et al. |
| 4,943,486 A | * | 7/1990 | Uchiyama ............... 428/496 |
| 5,117,065 A | * | 5/1992 | Savage et al. ......... 174/35 MS |
| RE34,173 E | | 2/1993 | Kerber |
| 5,458,928 A | * | 10/1995 | Kiyama et al. .............. 427/530 |
| 5,503,912 A | | 4/1996 | Setoyama et al. |
| 5,580,429 A | | 12/1996 | Chan et al. |
| 5,656,383 A | * | 8/1997 | Tanaka et al. .............. 428/698 |
| 5,700,551 A | | 12/1997 | Kukino et al. |
| 6,326,582 B1 | * | 12/2001 | North ......................... 427/576 |
| 6,723,391 B2 | * | 4/2004 | Derflinger et al. .......... 427/576 |

* cited by examiner

Fig. I Microstructure of the wear-resistant coating on an aircraft engine blade of titanium-based alloy, x500x2.

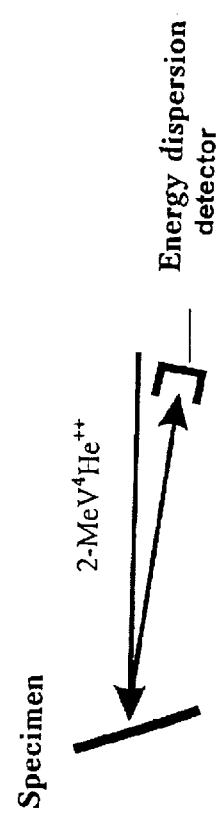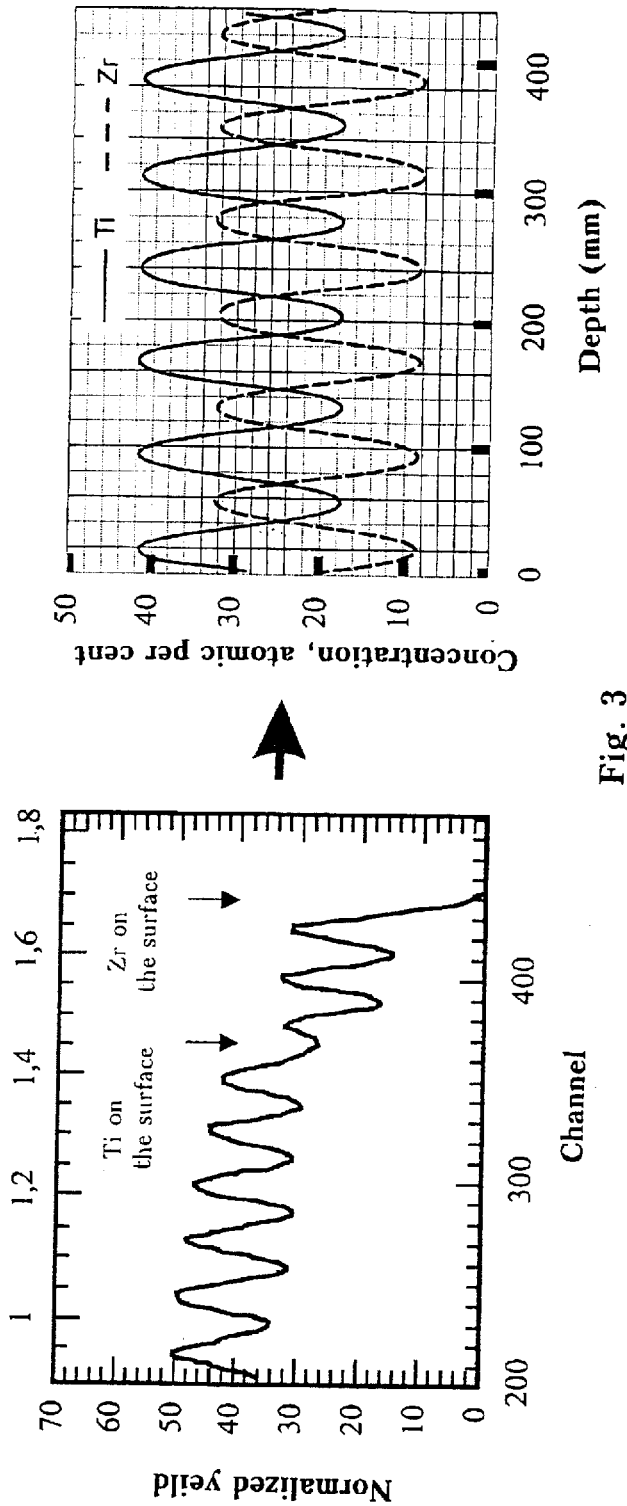
Fig. 3

|  | | Weight of blade, g | | Weight loss, mg | | Total weight loss, mg | |
|---|---|---|---|---|---|---|---|
| Number of test | Abrasive material, weight, g | Uncoated | Coated | Uncoated | Coated | Uncoated | Coated |
| 0 | 0 | 25,93467 | 26,68606 | 0 | 0 | 0 | 0 |
| 1 | 500 | 25,92766 | 26,68604 | 7,01 | 0,02 | 7,01 | 0,02 |
| 2 | 1500 | 25,9176 | 26,68412 | 10,06 | 1,92 | 17,07 | 1,94 |
| 3 | 2500 | 25,89843 | 26,68318 | 19,17 | 0,94 | 36,24 | 2,88 |
| 4 | 4500 | 25,87291 | 26,68266 | 25,52 | 0,52 | 61,76 | 3,4 |
| 5 | 6500 | 25,85201 | 26,68203 | 20,9 | 0,63 | 82,66 | 4,03 |
| 6 | 8500 | 25,83202 | 26,68087 | 19,99 | 1,16 | 102,65 | 5,19 |
| 7 | 10500 | 25,78469 | 26,67814 | 47,33 | 2,73 | 149,98 | 7,92 |
| 8 | 12500 | 25,75645 | 26,67761 | 28,24 | 0,53 | 178,22 | 8,45 |
| 9 | 14500 | 25,74019 | 26,6761 | 16,26 | 1,51 | 194,48 | 9,96 |
| 10 | 16500 | 25,72354 | 26,67494 | 16,65 | 1,16 | 211,13 | 11,12 |

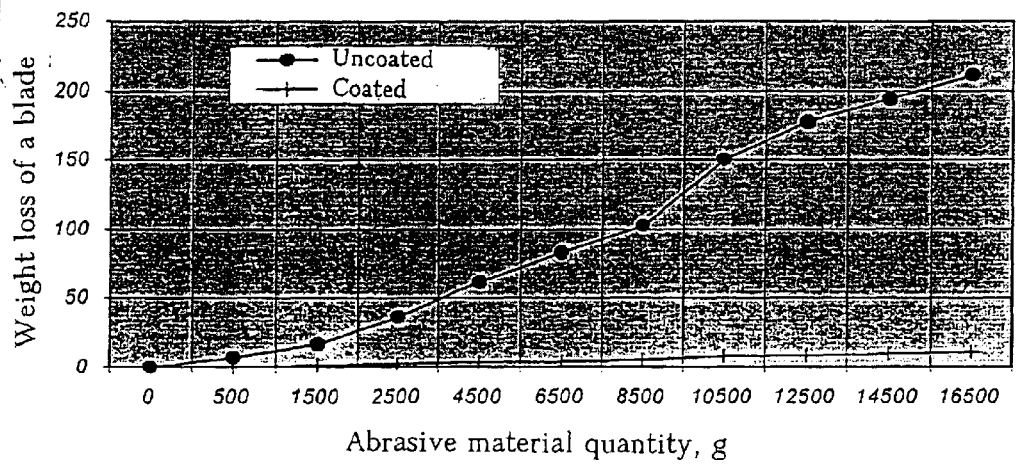

Erosion values represented by weight loss in testing conducted on gas-turbine engine compressor blades Testing conditions:

| Flow rate | 212 m/s |
|---|---|
| Temperature of air | 20 °C |
| Abrasive material | quartz sand, of 10 microns granularity |
| Attack angle | 20° |

Fig. 4

| Number of test | Abrasive material weight, g | Chord | | Chord wear, mm | | Total chord wear, mm | |
|---|---|---|---|---|---|---|---|
| | | Uncoated | Coated | Uncoated | Coated | Uncoated | Coated |
| 0 | 0 | 34,798 | 35,0012 | 0 | 0 | 0 | 0 |
| 1 | 500 | 34,7726 | 35,0012 | 0,0254 | 0 | 0,0254 | 0 |
| 2 | 1500 | 34,7726 | 35,0012 | 0 | 0 | 0,0254 | 0 |
| 3 | 2500 | 34,7472 | 35,0012 | 0,0254 | 0 | 0,0508 | 0 |
| 4 | 4500 | 34,6964 | 34,9758 | 0,0508 | 0,0254 | 0,1016 | 0,0254 |
| 5 | 6500 | 34,6456 | 34,9758 | 0,0508 | 0 | 0,1524 | 0,0254 |

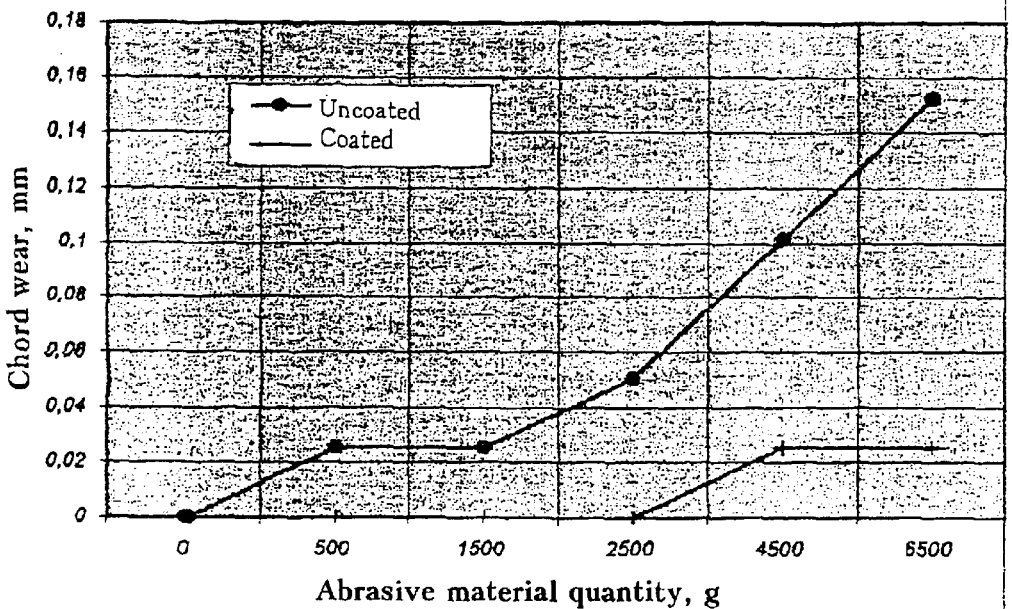

Erosion values represented by chord wear in testing conducted on gas-turbine engine compressor blades Testing conditions:

| Flow rate | 212 m/s |
|---|---|
| Temperature of air | 20 °C |
| Abrasive material | quartz-sand, of 10 microns granularity |
| Attack angle | 20° |

Fig. 5

METHOD FOR DEPOSITION OF WEAR-RESISTANT COATINGS AND FOR INCREASING THE LIFESPAN OF PARTS

FIELD OF THE INVENTION

This invention relates to metallurgy and machine building fields and more specifically to development of methods that improve service life and durability of machine components; to repair of components and reconstitution of their properties; and particularly to gas turbine blades and vanes; and primarily to coatings applied to metal surfaces of aircraft engine compressor blades and vanes.

BACKGROUND OF THE INVENTION

Frequently, aircraft and helicopters equipped with gas-turbine engines have to operate under conditions of considerable dust content in the air flow and high humidity of sea environment with aggressive elements of corrosive effects. These operation conditions result in abrasion-caused erosion and corrosion of aircraft parts, particularly the compressor blades. Under these conditions, geometry of blades is distorted, operating performances are deteriorated, fuel consumption increases, and engine maintenance and repair expenses grow considerably. The said deteriorating processes can not be efficiently avoided by installation of dust protective devices.

Eroded blades and vanes are generally restored by edge profile polishing or are replaced with new blades and vanes. Such blades and vanes are made of titanium-based alloys or high-alloy steels, which are expensive and difficult to process, so engine repair entails great expense.

U.S. Pat. No. 4,904,542, issued Feb. 27, 1990, reissued under Re.34,173 on Feb. 2, 1993, to Midwest Research Technologies Inc. describes a coating formed of a plurality of alternating layers of metallic and ceramic materials. The two materials selected for the layers have complementary wear resistant characteristics such that one is relatively ductile and the other is relatively hard and brittle. Preferably radio-frequency sputtering is employed to deposit the coating, since it does not produce excessive heating which could negate any prior heat treatment of the substrate onto which the coating is deposited.

Also known are RU Patents No.2,061,090 BI No.15, 1996 and No.2,106,429 BI No. 7, 1998, that describe methods of multi-layer coating deposition on parts and tools, including transition metal coatings. Zirconium is offered as an adhesive bondcoat that is applied to the substrate before the coating; or there is an alternative method of applying metal oxides between the metal layers.

A deposition technique is also known to produce thin films of CNx with implantation of nitrogen ions from plasma. U.S. Pat. No. 5,580,429 issued Dec. 3, 1996, to Northeastern University describes cathodic/anodic vacuum arc sources with a plasma ion implantation deposition system for depositing high quality thin film coatings on substrates. Both cathodic and anodic vacuum arc deposition sources, CAVAD, are used to create a plasma vapor from solid materials composing the cathode and/or anode in the cathodic and/or anodic arc, respectively. Gases, e.g., hydrogen or nitrogen can be in the deposited films by creating a background plasma of the desired gas using either RF energy, thermionic emission, or consequential ionization of the gas passing through the arc or around the substrate. Highly negative pulses are applied to the substrate to extract the ions and provide them with the appropriate energy to interact with the other species in the thin film formation on the substrate to form the desired films. The substrate is bombarded with ionized particles to form carbon nitrides with variable [N]/[C] ratios.

RU Patent No.2,062,818 issued Jun. 27, 1996, describes deposition of metal-containing coatings on large substrates in vacuum. The method includes inert gas ion beam cleaning of the substrate and metal-coating deposition by cathodic sputtering in the inert gas discharge when the substrate is bombarded with the inert gas ion beam that is formed by an accelerator of closed-type drift of electrons at an inert gas ion energy of 50–150 eV. Technically, this method is the closest one to the present invention.

However, the aforesaid U.S. Pat. No. 4,904,542, U.S. Pat. No. 5,580,429 and R.U. 2,062,818, R.U. 2,061,090, and R.U. 2,106,429 do not fully cover the problems of durability and wear resistance, especially as far as aircraft engine blade airfoil surfaces are concerned, which must meet various specific requirements to their wear and corrosion resistance properties and at the same time retain a certain level of their mechanical and, particularly, fatigue characteristics.

Therefore, there is a need to provide improved erosion and corrosion resistance and, as a result, improved reliability and durability of components of various machines, tools and equipment, especially gas turbine engine compressor blades and vanes. That is proposed to be achieved by vacuum plasma technology involving ion implantation.

SUMMARY OF THE INVENTION

It is an object of the present invention to provide a technique of coating deposition on metal surfaces, particularly on components of machines, steam and gas turbines, and even more specifically on aircraft engine compressor blades and vanes, that will ensure improved erosion and corrosion resistance and retain the sufficient level of mechanical properties, primarily, fatigue characteristics.

It is a further object to restore the metallic surface of an eroded or corroded metal substrate, particularly the profile surface of a working blade of a gas turbine engine compressor to its original geometric shape and profile parameters.

To achieve the aforementioned objects, a coating is deposited that consists of at least three or four microlayers with certain thickness and compositions. By the term "microlayer", in this specification and claims, is meant a layer of pure metal, multiple-component substitution or interstitial metal alloy with non-metal atoms, or interstitial phases based on the said metals, i.e. the metal carbides, nitrides, borides, or complex compounds of the said phases, e.g., carbonitrides, carboborides, etc.

The said coating is produced by means of ion plasma deposition; in the preferred embodiments, the said coating consists of a special microlayer (hereinafter referred to as "submicrolayer"); the said submicrolayer is a rare earth metal, particularly scandium, yttrium or lanthanum and lanthanoids; the said coating also comprises a plurality of microlayers wherein each of said microlayers comprises a material selected from the group consisting of the Group IVA–VIA (Ti, Zr, Hf, V, Nb, Ta, Cr, Mo, W) or alloys thereof, interstitial solid solutions of elements (carbon, nitrogen, boron), nitrides, carbides, or borides of metals, wherein one or more of said microlayers has been subjected to high energy non-metallic (argon, nitrogen, carbon, boron) ion deposition.

The said microlayers of metals or said alloys or metal/non-metal compounds deposited by means of deposition of ions or neutral particles under an appropriate inert gas or non-inert gas, such as nitrogen, methane, acetylene, diborane, should be deposited to a desired thickness, preferably 0.1–10 microns.

The microlayer may be an essentially discrete layer distinct from the adjacent substrate or microlayers; or it may be a mixture therewith. Each of the microlayers may comprise a pure metal or an alloy thereof as prepared, for example, if more than one metallic cathode are simultaneously activated within the chamber or the cathodes are made of alloys. The order of the plurality of microlayers can be selected by opting between corresponding gas atmospheres in the working chamber and by activating the appropriate cathode(s). The number and order of microlayers constituting the fill coating and the inert or non-inert gas ions deposition can be selected depending on the specific requirements determined by the desired performances of machine parts or the whole machine. For example, it is essential that guide blades of the aircraft engine compressor had very hard and wear resistant surfaces, and at the same time fatigue characteristics of the substrate alloy would not play a restrictive role, since such blades are not subjected to high fatigue. On the contrary, working blades of the compressor are very sensitive to fatigue conditions as such blades have to operate under considerable fatigue stresses. Therefore, coatings designed for guide and working blades differ in their thickness and number of microlayers.

The method claimed involves deposition of, at least, three functional microlayers:

1—a damping, corrosion-resistant microlayer of a rare earth metal from the Groups IVA–VIA or a replacement alloy based on said metals, deposited in inert gas atmosphere to the desired thickness, preferably 0.02–5 microns, that provides relaxation of erosion-caused stresses between solid layers and protects from corrosion-aggressive agents of media;

2—a reinforcing microlayer consisting of interstitial solid solutions of nitrogen, boron, carbon in transition metals of the second layer, deposited to the desired thickness, preferably 0.04–10 microns, in a non-inert gas (nitrogen, diborane, methane, or acetylene, respectively, at a partial pressure of said gases $0.05–5\times10^{-1}$ Pa) atmosphere, that provides a gradual transition to a high strength layer;

3—a wear-resistant, high strength microlayer consisting of interstitial phases such as nitrides, borides, carbides or complex compounds thereof based on said transition metals, deposited to the desired thickness, preferably 0.1–12.5 microns, in corresponding non-inert gas atmospheres at a partial pressure of $0.1–5\times10^{-1}$ Pa, that provides resistance to erosion effects of abrasive particles.

The deposition of the aforementioned functional microlayers is carried out by activating the appropriate cathode made of a pure metal or a multiple-component alloy, by selecting the necessary partial pressure and composition of the gas atmosphere, and by controlling the appropriate time of deposition as required.

FIG. 1 shows an exemplary microstructure of the claimed coating on an aircraft engine compressor blade of titanium alloy.

Simultaneously, one or more microlayers is subjected to non-metallic (argon, nitrogen, carbon or boron) ion treatment by means of an ion implantor; it is important that such treatment must be carried out directly in the working chamber of the ion-plasma device, simultaneously with or immediately following the deposition process. The ion treatment is carried out with ions at $5\times10^3–1\times10^5$ eV and radiation dose of $5\times10^{13}–1\times10^{18}$ ion/cm².

The energy of these implanted ions is considerably higher than the energy of ions formed in the deposition chamber. These ions penetrate deep into the crystal lattice of the deposited metals or interstitial phases and cause changes in the interstitial element concentration, bring about formation of solid solutions and superstructural, non-stoichiometric compounds, and result in submicrostructure and strain modifications. All these result in improved adhesion strength and higher resistance of the coatings to erosion wear. Under the effect of such ion treatment, local temperature peaks may occur followed by rapid cooling of these surface localities, that results in the improvement of strength and tribological properties of the deposited microlayers.

Figure 2:
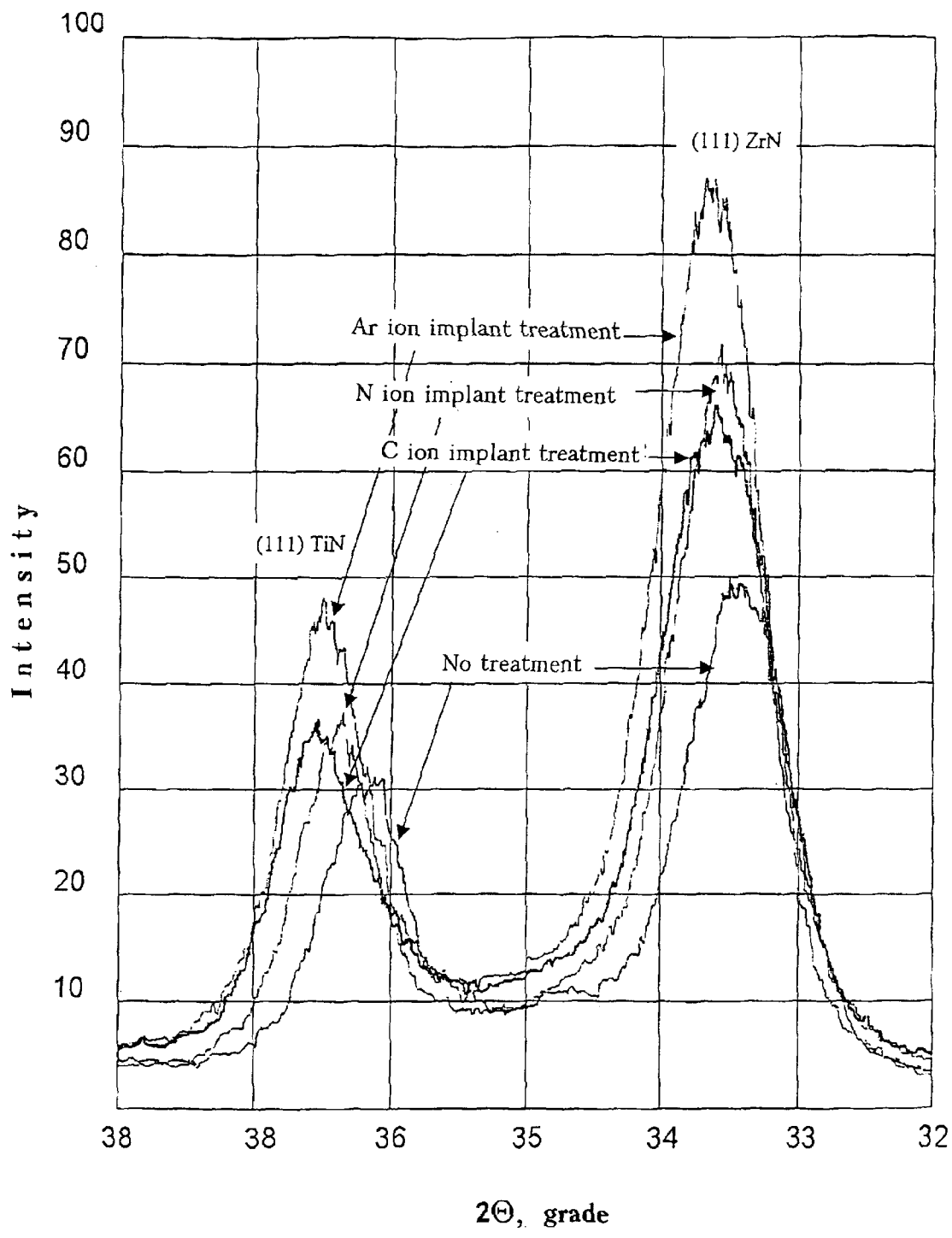

FIG. 2 shows an exemplary X-ray pattern obtained from coatings deposited under various ion implant treatments in the deposition chamber; and FIG. 3 shows the results of investigation by means of the Rutherford back scattering.

It is preferable to use a high energy pulsed ion source in order to reduce risks of overheating and temperature warping of a machine part under ion plasma deposition, which is especially important for aircraft engine compressor blades. Such source produces ions that have the energy high enough for the ions to be implanted into the crystal lattice of deposited phase and to create high-tensile compounds. The following rapid cooling of affected zones prevents the bulk material from overheating, causes the surface substructure to become finer and brings about nanocrystalline or amorphous structures in the surface microlayers.

The ion treatment improves, not only the resistance to erosion and corrosion, but also the endurance limit of machine components, especially under many-cycled fatigue conditions. The improvements are achieved due to the compressing strains generated in the interfacial boundaries and stable defects in the structure caused by the formation of fine precipitates of multiple-component metal/non-metal compounds of variable valence.

However, such complicated processes of multiple-layer coating deposition and ion implanted treatment may induce elevated internal stresses in the surface layers of machine components. In order that the stress distribution be favorable, it is necessary to carry out an additional treatment of the coated parts immediately after the deposition process.

After the coated parts are unloaded from the deposition chamber, they are subjected to vibromechanical treatment with micro-pellets.

Therefore, the method claimed includes the following steps:

(a) Preparing the surface for ion-plasma deposition.

(b) Installing cathodes made of metals and alloys to be deposited.

(c) Placing workpieces or substrates into the ion plasma deposition chamber equipped with an ion implantor.

(d) Ion beam cleaning of the surface.

(e) Ion plasma depositing of coating comprising a plurality of microlayers with the required compositions and gas pressures in the deposition chamber.

(f) High-energy ion treatment of one or more microlayers during their deposition or after the coating has been deposited.

(g) Cooling and unloading the workpieces.

(h) Vibro-mechanical treatment according to the preset regime.

BRIEF DESCRIPTION OF THE DRAWINGS AND PHOTOGRAPHS

Figure 6:
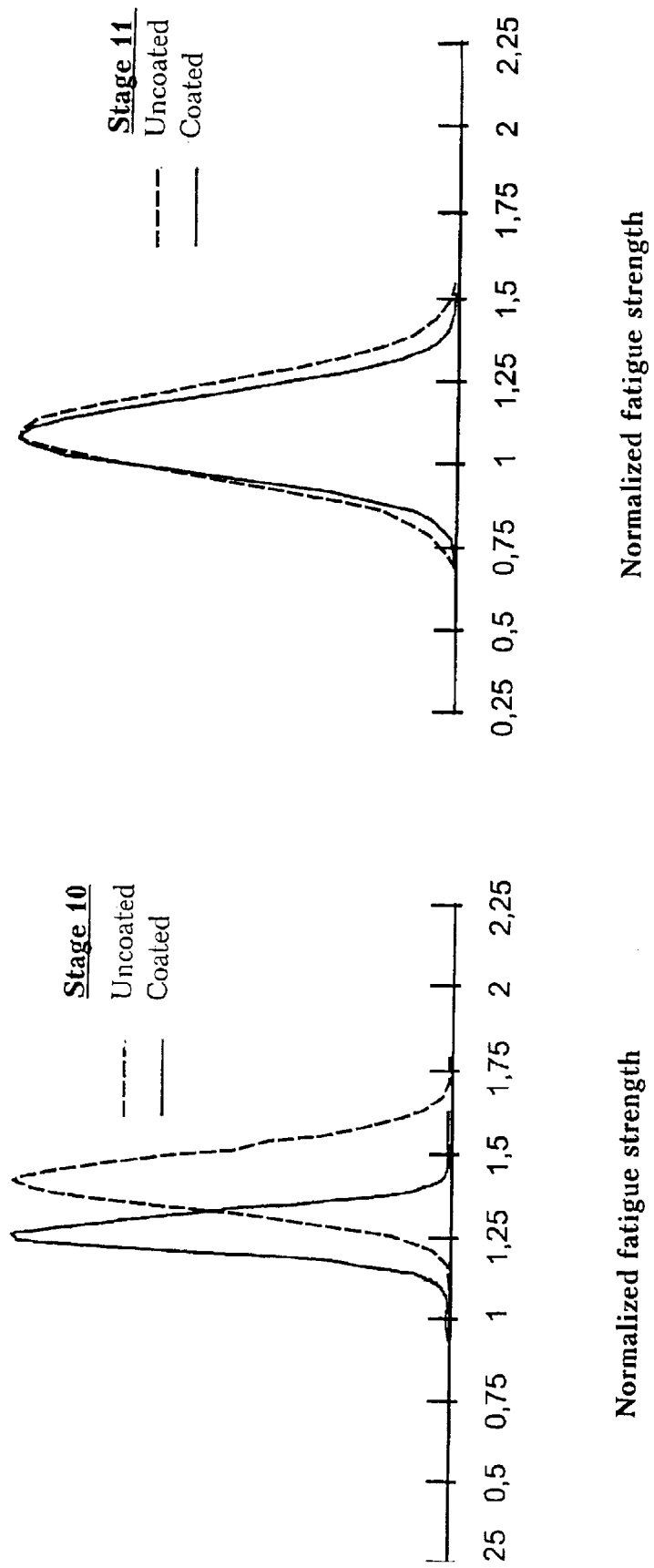

FIG. 1 Microstructure of the wear-resistant coating on an aircraft engine blade of titanium-based alloy, ×500×2;

FIG. 2 X-ray diffraction patterns from coatings with various implanted ions and regimes;

FIG. 3 Results of investigation of coating by means of Rutherford back scattering;

FIG. 4 Erosion values represented by weight loss in testing conducted on gas-turbine engine compressor blades;

FIG. 5 Erosion values represented by chord wear in testing conducted on gas-turbine compressor blades;

FIG. 6 Fatigue test results obtained on test specimens and compressor blades with and without coating.

DETAILED DESCRIPTION OF PREFERRED EMBODIMENTS

In practice, ion-plasma deposition of metal ions is carried out following the general principles of ion plasma deposition in a low pressure chamber from the corresponding metal cathode in an inert gas atmosphere, for instance, in argon or, in order to produce a nitride metal coating, in nitrogen, with a considerable potential difference between the hot cathode and a workpiece that plays a role of the anode.

The coatings listed in Table 1 were prepared as follows. Ion-plasma deposition and high-energy ion treatment were conducted in HHB-6.6 type of equipment with an ion implantor of "Pulsar" type, or an implantor with a non-heated cathode, equipped with high accuracy optical pyrometers and inert/non-inert gas feeding systems monitored to feed the gas atmosphere into the ion plasma deposition chamber and implantor.

Titanium, steel or nickel-based alloy aircraft engine compressor blades were first treated with high energy ion argon plasma at a potential difference up to 1,500 V between titanium cathode and the blades, to clean the blade airfoil surface from any solid, liquid or adsorbed gas impurities.

Let us consider in more detail the coating deposition embodiment designated as No. 8. After the blades of BT16 alloy were treated with abrasive liquid, washed and dried, the blades were then placed into the ion-plasma deposition chamber where they were subjected to ion cleaning in inert gas atmosphere and then they were coated with a plurality of microlayers, starting with the scandium submicrolayer.

The scandium submicrolayer of 0.3–0.8 micron in thickness was deposited on the blade airfoil surface, at a scandium cathode heating current of 10–200 A to provide a temperature of 200–400° C. and a potential difference of 100–1,000 V between the blades and the scandium cathode. Titanium cathodes and zirconium cathode were not heated this time. The stage took approximately 2 minutes and the blades were rotated at 2.5 rpm. A titanium microlayer having a thickness of 0.6–1.6 microns was then deposited by inactivating the scandium cathode by switching off its source of current and heating the titanium cathode by applying a current of 20–200 A and a potential difference of 100–800 V between the anode and the blades under the argon atmosphere. A temperature of the cathode up to 700° C. was achieved over this stage. Then a titanium microlayer having a thickness of 1–2 microns was deposited under a nitrogen and argon atmosphere in the working chamber. Then pressure was increased and a microlayer of titanium nitride was formed of a thickness approximately 2–4 microns. The temperature of blades was maintained within 480–550° C. over the whole deposition process to prevent any phase transformation in the bulk material.

The titanium cathode was inactivated and zirconium cathode heated to the same temperature by the same current density and potential difference as for the preceding titanium deposition step. During the deposition of titanium nitride and zirconium nitride there was nitrogen implantation carried out. The aforesaid deposition steps were repeated several times in the same sequence in order to obtain the desired thickness of the coating.

In alternative embodiments the foregoing titanium and zirconium ion deposition steps may be repeated, substituted or interchanged with titanium nitride and/or zirconium nitride ion deposition steps carried out under a nitrogen atmosphere. Interchanging of different microlayers is provided by the alternating heating of the titanium or zirconium cathodes under an argon or nitrogen atmosphere. An example is shown in FIG. 3 of changes in composition of various microlayers of the coating deposited following the claimed method and analyzed by means of the Rutherford back scattering. Clearly, a desired total thickness of coating can be obtained from a plurality of microlayers, preferably 3–20.

In preferred embodiments, each or some of the microlayers of the fill coating at different stages in its preparation may be subjected to high energy ions of argon, nitrogen, carbon, or boron as selected by control of the atmosphere in the ion implantor under a potential difference between the ion-implantor electrode and the blades of 10–50 kV.

Ion implantors are well-known in the art.

In the present embodiment, the ion implant of "Pulsar" type is provided with a low pressure arc between a screened cathode spot and a widened anode part of the discharge. The arc provides a high current of non-metallic ions of argon or a non-inert gas medium injected into the implantor from the developed emission surface of the anode plasma. Cathode ion emission is negligible since the cathode is not heated. Further, on screening of the cathode spot prevents its interference with the anode plasma and lowers contamination of the gas-discharging plasma by metallic ions. Accordingly, only ions from the arc anode plasma enter the ion optical system which forms the beam of high-energy ions. The plasma contains less than 0.1% of metal ions.

In the process according to the invention the following process parameters were used:

| | | |
|---|---|---|
| Accelerating voltage | | up to 50 kV |
| Ion beam amperage: | in impulse | 1 A |
| | average | 50 mA |
| Beam cross-section: | wide beam | 150 cm$^2$ |
| | convergent beam | 5 cm$^2$ |
| Impulse duration | | $1 \times 10^{-3}$ sec$^{-1}$ |
| Repetition rate | | 1–50 sec$^{-1}$ |

Ion types - any gas ions, including ions of chemically active and inert gases

A beam of nitrogen or boron or carbon or argon ions, emanating from an emitting electrode is accelerated through an accelerating electrode and an outlet electrode to intermittently impinge, as desired, on the individual microlayers of the substrate.

Table 1 gives the structural order and compositions of several examples of coated substrates according to the invention.

TABLE 1

| Example No. | Substrate material | No. of microlayers in the coating | Total coating thickness (microns) | Material and order of coating |
|---|---|---|---|---|
| 1 | Titanium alloy | 7 | 12–16 | Sc, Ti + Zr, (Ti,Zr(N)), Zr, (Zr(N)), ZrN + Ar |
| 2 | Stainless steel | 9 | 10–12 | Sc, Ti + Zr, (Ti,Zr(N)), Ti N + N, ZrN + N* |
| 3 | Titanium alloy | 8 | 6–8 | Ti, (Ti(N)), TiN, ZrN + N* |
| 4 | Nickel-based alloy | 4 | 4–6 | Y, Ti, (Ti(N)), TiN + Ar |
| 5 | Titanium alloy | 17 | 14–18 | Sc, Ti, (Ti(N)), TiN + N, Ti, +N, Zr, (Zr(N)), TiN, ZrN + N* |
| 6 | Nickel-based alloy | 19 | 18–22 | REM, Zr, (Zr(N)), ZrN, +Ar, Zr, (Zr(N))ZrN + Ar, Ti, (Ti(N)), TiN + Ar* |
| 7 | Titanium alloy | 46 | 18–22 | Sc, Ti, (Ti(N)), TiN, +N, Zr, (Zr(N)), ZrN, Ti, (Ti(N)), TiN + N, Ti, (Ti(N)), TiN + N, Zr, (Zr(N)), ZrN |
| 8 | Ti-6Al-4V alloy | 19 | 14–18 | Sc, Ti, (Ti(N)), TiN, +N, Zr, (Zr(N)), ZrN, +N, Ti, (Ti(N)), TiN* |

TABLE 1-continued

| Example No. | Substrate material | No. of microlayers in the coating | Total coating thickness (microns) | Material and order of coating |
|---|---|---|---|---|
| 9 | Titanium alloy | 25 | 28–32 | Sc, Ti, (Ti(N)), TiN + NZr N + TiN, Zr + N, Ti, (Ti(N)), TiN + Ar |
| 10 | Titanium alloy | 40 | 16–20 | Cr, (Cr(C)), Cr$_3$C$_2$, ZrC + C, Zr, (Zr(C)), ZrC + C, ZrC, Zr, Cr$_3$C$_2$ + ZrC* |
| 11 | Titanium alloy | 57 | 14–18 | Y, Ti, (Ti(C)), TiC + C, Ti, (Ti(C)), ZrC + C, Zr + C, Ti + C, ZrC, Ti, (Ti(C)), TiC + C, ZrC + Ti C, ZrC* |
| 12 | Titanium alloy | 49 | 14–20 | Y, Zr, (ZrC)), ZrC + CZr, (Zr(C)), TiC + C, Ti (Ti(C)), TiC + C, Zr, (ZrC)), ZrC* |

Note: +C, +N, +Ar - denote carbon, nitrogen or argon ion implant treatment respectively;
(Ti(N)), (ZrN)), (Ti ©), (Zr ©), etc. - the microlayers comprising interstitial solid solutions of nitrogen and carbon in the corresponding metal;
*- the microlayers are deposited in the specified order several times to obtain coating of desirable thickness;
Ti + Zr - the microlayer comprising of the mixture of the metals specified.

FIG. 4 and FIG. 5 show erosion resistance of complex coatings comprising a plurality of microlayers produced, according to the invention, of zirconium, titanium and nitrides thereof, and subjected to erosion tests on Ti-6Al-4V alloy compressor blades with implanted nitrogen ions as compared to the non-coated blades. The Figures also specify the testing conditions.

Specified below is wear resistance test results, of coating specimens having the same number of microlayers and a total thickness of 12–16 microns with and without nitrogen or carbon implanted ions.

1. BT8 alloy (Ti-6Al-3.5Mo-0.5Zr) without coating=1.0
2. Coating on BT8 alloy—Sc—Ti—(Ti(N))—TiN—Zr—(Zr(N))—ZrN=0.12
3. Coating on BT8 alloy—Sc—Cr—(Cr(C))—Cr$_2$C$_3$—(Zr(N))—ZrC=0.26
4. Coating on BT8 alloy—Sc—Ti—(Ti(N))TiN+N—Zr—(Zr(N))+N=0.014
5. Coating on BT8 alloy—Sc—Cr—(Cr(C))—Cr$_2$C$_3$+C—Zr—Zr(C)+C=0.037

Testing Conditions:

Velocity of the air-abrasive flow—120 m/sec

Temperature—room temperature

Abrasive material—quartz sand, of 10 microns granularity

Abrasive material quantity—10 kg

Attack angle—20°

Specimens 4 and 5 are with implanted nitrogen and carbon ions, respectively

Wear resistance was measured by weight loss as compared with non-coated specimens.

Corrosion Tests

Coated as per the invention and non-coated steel and titanium blades were subjected to corrosion tests by the method as follows.

The titanium blades were heated at 300° C. and the stainless steel blades at 420° C. in a chamber for 1 hour. The blades were subsequently cooled in a 3% sodium chloride solution, held in a humid chamber for 23 hours and the cycle was repeated 10 times. These tests were meant to simulate 2 years of fan blade operation under conditions of humid tropical climate. Corrosion resistance evaluation was made by visual examination of the blades and vanes after each cycle and by determination of the change in mass during and after the corrosion tests.

The results showed that non-coated blades had a typical change in mass of 1.3 g/m, in contrast to the coated blades which had no corrosion as measured visually neither any change in weight.

Another test was conducted in a chamber at 350° C. in 3% sodium chloride solution vapors for 3 days. This test was meant to estimate pitting corrosion on the leading edge of the blades (to simulate corrosion conditions at moorings), and then the data obtained were averaged over 8 blades (see below):

1. Non-coated blades—over 20 pitting marks in the leading edge
2. Titanium nitride coated blades—9–12 pitting marks
3. Blades coated with a plurality of microlayers and argon implanted according to the invention—1–3 pitting marks.

The comparison tests conducted on non-coated blades and the blades coated according to the invention have shown that the fatigue strength of the coated blades does not deteriorate and thus provides a high level of durability and high endurance limit (FIG. 6). The fatigue test parameters were corresponding to the actual operating conditions of aircraft engine performance.

After the laboratory tests had been conducted, natural scale tests were performed on real engines, with abrasive material particles of 100–200 microns at the sand consumption rate of 1.2 kg/hour. These tests have also demonstrated a considerable improvement in erosion resistance of the aircraft compressor guide blades and rotor under severe conditions as compared to the non-coated blades. FIG. 7 shows the surface of the blades. Therefore, the results obtained can be used to develop a repair technology designed for improving durability of new blades of an aircraft engine.

Industrial Applicability

The invention claimed can be used to improve durability and endurance limit of machine components by depositing wear and corrosion resistant coating on the component parts used in a variety of machine building industries, and to repair and restore component parts worn in operation. Particularly, positive results have been obtained for restoring worn-out compressor blades and for improving aircraft engine compressor's durability and service life. Technologies based on the claimed invention can also be utilized in other industries, such as manufacture of consumer goods, domestic appliances, and sporting equipment.

What is claimed is:

1. A method for depositing wear-resistant coatings on metal surfaces of machine components and articles to improve service life of parts and to reshape geometrical size of parts during repair, said method comprising the following steps:
   (i) providing an ion-plasma deposition chamber;
   (ii) locating as an anode said machine components or articles being treated inside said ion-plasma deposition chamber;
   (iii) locating in said chamber cathodes made from the Group IVB–VIB metals and/or alloys thereof;
   (iv) establishing in said chamber a gas atmosphere wherein the gas is selected from the group consisting of inert or non-inert gases and mixtures thereof;
   (v) effecting, whenever necessary, ion cleaning of surfaces of said machine components or articles;
   (vi) effecting selective ion-plasma deposition of at least three layers of a coating, wherein:
      at least one layer (a) consists of said metals, mixtures thereof or substitution alloys, said at least one layer having a thickness of 0.02–5 microns,
      a second layer (b) consists of interstitial solid solutions of nonmetallic atoms of nitrogen, carbon, and boron in said Group IVB–VIB metals, said second layer having a thickness of 0.4–10 microns, and
      a third layer (c) consists of chemical compounds of interstitial chases of said Group IVB-Group VIB metals with nonmetals in the form of nitrides, carbides, borides and mixtures thereof, said third layer having a thickness of 0.1–12.5 microns, wherein said first second and third layers have thickness ratios of about 1:2:2.5 respectively;
   (vii) subjecting one or more of said layers to treatments by implanting thereinto non-metallic ions simultaneously with the step of effecting ion-plasma deposition, said non metallic ions selected from the group consisting of argon, nitrogen, carbon or boron ions; and
   (viii) cooling and unloading said machine components or articles from said chamber.

2. A method as claimed in claim 1, characterized in that after having been cooled and unloaded said machine components or articles are subjected to vibromechanical treatment with pellets.

3. A method as defined in claim 1, wherein said machine components or articles are made from titanium, titanium alloys, steels or nickel-based alloys.

4. A method as defined in claim 1, wherein said cathodes are titanium alloys which after deposition form a composition similar to the base material of a machine component or article.

5. A method as defined in claim 1, wherein there are from 3–500 layers, and said layers (a), (b), (c) alternate successively.

6. A method as defined in claim 1, further comprising the step of depositing a first layer consisting of scandium, yttrium or other rare earth metal having a thickness of 0.02 to 0.08 micron before step (vi).

7. A method as defined in claim 1, wherein the gas atmosphere is nitrogen, acetylene, methane or diborane.

8. A method as defined in claim 1, wherein said step of ion deposition is effected with ions of argon, or nitrogen, or carbon, or boron at an accelerating voltage of 10–50 kV, at a radiation dose of $10^{14}$–$10^{18}$ ion/sq.cm. and an energy of ions of $5 \times 10^3$–$1 \times 10^5$ eV.

9. A method as defined in claim 1, wherein said ion-plasma deposition step (vi) comprises the steps of depositing:
   (a) a scandium layer in an argon atmosphere;
   (b) a titanium layer in an argon atmosphere;
   (c) a layer comprising a solid solution of implanted nitrogen ions in titanium in an atmosphere comprising a mixture of nitrogen and argon;
   (d) a layer comprising titanium nitride implanted with nitrogen ions in nitrogen atmosphere;
   (e) a zirconium layer in argon atmosphere;
   (f) a layer comprising a solid solution of implanted nitrogen ions in zirconium in an atmosphere comprising a mixture of nitrogen and argon;
   (g) a layer comprising zirconium nitride implanted with nitrogen ions in nitrogen atmosphere; and
   (h) the step of repeating said steps (b–g) in that order to provide a desired number of layers.

10. A method as defined in claim 1, wherein said deposition step (vi) comprises depositing:
   (a) a first layer comprising alloys of titanium and zirconium in an inert gas atmosphere;
   (b) a layer comprising alloys of titanium and zirconium implanted with nitrogen atoms in an atmosphere of a mixture of said inert gas and nitrogen;
   (c) a layer comprising titanium and zirconium nitrides implanted with nitrogen ions in nitrogen atmosphere;
   (d) repeating said steps (a)–(c) to provide a desired number of layers to form a multilayer coating; and
   (e) implanting argon ions into the multilayer coating.

11. A method as defined in claim 10, wherein said deposition step (vi) comprises depositing:
   (a) a layer of titanium and zirconium alloys in an inert gas;
   (b) alloys of titanium and zirconium with boron in a mixture of an inert gas with diborane;
   (c) titanium an zirconium borides implanted with boron;
   (d) repeating said steps (a)–(b) in that order to provide a desired number or layers to form a multilayer coating; and
   (e) implanting argon ions in the multilayer coating.

12. Machine components and articles deposited by the method as claimed in claim 1.

13. A coating of metal surfaces, comprising deposited on said surfaces by ion-plasma deposition process at least three layers, said at least three layers comprising the following:
   at least one first layer consisting of Group IVB–VIB metals, a mixture thereof or substitution alloys, said layer having a thickness of 0.02–5 microns,
   at least one second layer consisting of interstitial solid solutions of nonmetal atoms of nitrogen, carbon, boron in said Group IVB–VIB metals, said second layer having a thickness of 0.4–10 microns,
   at least one third layer of chemical compounds of interstitial phases of said Group IVB–VIB metals with nonmetals in the form of nitrides, carbides, borides and mixtures thereof, said layer having a thickness of 0.1–12.5 microns, wherein said first second and third layers have thickness ratios of about 1:2:2.5 respectively,
   wherein implanted in at least one of any of said layers are non metal ions selected from the group consisting of argon, nitrogen, carbon or boron ions.

14. Machine components and articles having a coating according to claim 13.

* * * * *

UNITED STATES PATENT AND TRADEMARK OFFICE
CERTIFICATE OF CORRECTION

PATENT NO. : 6,797,335 B1
DATED : September 28, 2004
INVENTOR(S) : Paderov et al.

It is certified that error appears in the above-identified patent and that said Letters Patent is hereby corrected as shown below:

Title page,
Item [76], Inventors, please change the first name of the inventor from "Anatol y" to correctly read: -- Anatoly --; please change the last name of the second inventor from "Ve Xler" to correctly read: -- Veksler --.

Drawings,
Figure 3, in the description, please change the word "dack" to correctly read: -- back --.
Figure 3, in the Y axis, please change the word "yeild" to correctly read: -- yield --.
Figure 6, on the chart on the left hand side, along the X axis, please change "25" to correctly read: -- 0,25 --.

Column 1,
Line 26, after the word "the" (first occurrence), please change the word "fill" to correctly read: -- full --.

Column 6,
Line 56, after the word "the" please change the word "fill" to correctly read: -- full --.

Column 10,
Line 33, please insert a comma after the word "first".

Column 12,
Line 27, please insert a comma after the word "first".

Signed and Sealed this

First Day of March, 2005

JON W. DUDAS
*Director of the United States Patent and Trademark Office*